(12) United States Patent
Seymour

(10) Patent No.: US 6,777,952 B2
(45) Date of Patent: Aug. 17, 2004

(54) METHOD AND APPARATUS FOR TESTING CABLES

(75) Inventor: Arthur F. Seymour, Deerfield, IL (US)

(73) Assignee: Elenco Electronics Inc., Wheeling, IL (US)

( * ) Notice: Subject to any disclaimer, the term of this patent is extended or adjusted under 35 U.S.C. 154(b) by 0 days.

(21) Appl. No.: 10/059,846

(22) Filed: Jan. 29, 2002

(65) Prior Publication Data
US 2003/0141875 A1 Jul. 31, 2003

(51) Int. Cl.⁷ .................... G01R 19/00; G01R 31/08
(52) U.S. Cl. ............................... 324/525; 324/66
(58) Field of Search ................ 324/525, 500, 324/512, 66

(56) References Cited

U.S. PATENT DOCUMENTS 3,492,571 A    1/1970   Desler ................. 324/73
5,181,521 A *  1/1993   Lemelson ............. 600/549
5,559,427 A *  9/1996   Hinds et al. ......... 324/66
5,933,570 A    8/1999   Fujita ................. 386/96

* cited by examiner

Primary Examiner—N. Le
Assistant Examiner—Donald M. Lair
(74) Attorney, Agent, or Firm—Meroni & Meroni, P.C.; Charles F. Meroni, Jr.

(57) ABSTRACT

The integrity, connection and location of cable wire termination extending between two different points is checked for shorts between wires and open wires. The actual remote termination plug configuration can be mapped from testing end to determine remote plug wiring. The actual location of the remote terminated end is identified either by a visual indicator, a electronically recorded message made by operator at time of cable termination, or both.

4 Claims, 4 Drawing Sheets

METHOD AND APPARATUS FOR TESTING CABLES

FIELD OF THE INVENTION

This invention relates to methods and apparatus for testing cables used in telephone, communication, video cables, and computer networks for identification of cable location and for a number of wire faults, such as (1) shorts between wires (2) open wires (3) improper connection of wires to terminating plugs, and (4) reversed wired terminating plugs.

BACKGROUND OF THE INVENTION

During the installation of and interconnection of various equipment in telephone, video, and computer networks, it is necessary to make frequent wiring checks as to the integrity of connections made by means of exchange cable which is utilized to interconnect the various equipment. In many instances cable connectors are installed at the site of use using hand tools and special connectors. It is necessary that the cable be checked for proper connection of the plug terminals and identified as to its remote location when connected to the computer hub, telephone KSU (Key Switching Unit), or video distribution box.

A number of test facilities have been developed for making a number of checks of cable with connectors on ends so as to ascertain shorts, continuity and proper wire interconnection. One such test facilities is shown in U.S. Pat. No. 3,492,571 to D. A. Desler assigned to the Western Electric Co., Inc., where a multi-conductor cable having plugs at opposite ends is checked for shorts, opens and wires that are misconmected or cross-connected between terminals at the respective plug ends of the cable. This test facility includes means for sequentially applying test pulses to terminals at one plug end and sensing the receipt of the signals at the second plug end. The received signals are then compared with signals generated by a reference program circuit. The signals from the plug end of the wire and the reference circuit are applied to a comparison circuit to determine correctness, and if the signals do not properly compare then error signals are generated. The error signals are utilized to operate visual displays that provide information as to the faulty wires and the type of error determined by the comparison circuit.

There is a need for a lightweight, portable test unit for checking cables and cable wiring on a users site that can be transported, set up and run by a single operator. In each site or office such a test unit should be able to test for shorts between wires, open wires and misconnected or cross-connected wires, and this test unit should also have the capability of identifying the location of the remote terminated end of the cable under test. In addition, the test unit must be easy to use and user friendly.

BRIEF SUMMARY OF THE INVENTION

This invention contemplates, among other things, methods and apparatus for conducting a number of tests on cables such as improper wire or cross wire connections, open wire conditions, actual remote plug wiring, and remote plug location.

More particularly, an operator determines a name for the location of the end of a cable to be terminated. This name could be as simple as a room number or as complex as a floor number, company name, office area, and desk number. This name could then be recorded onto a sheet of paper next to a load number (i.e. Load1=3rd floor, office 3, desk 2), or the load could be plugged into the test unit and the location name could be recorded into the memory of the test unit using speech (i.e. record button is pressed and operator says "Third floor, office three, desk two"). The associated load is then connected to the cable at that location. This process is repeated for a number of loads.

The operator then proceeds to the originating point of the cables to be tested, usually a computer hub, video cable box, or Telephone Key Switching Unit (KSU). Cable integrity should be tested first to insure other readings are not corrupted by a cable fault. The test unit is then placed into the mapping mode and each cable is tested wire by wire for proper termination, no open wires, and no shorted wires. This process is repeated until the integrity of each cable has been verified.

The operator then places the test unit into the locating mode and connects a cable to be identified to the test unit.

During this test, the operator presses play and the test unit plays the previous recorded message associated with the load on the end of the cable now connected to the test unit. Or the operator checks the light indicating the load number and checks his written log to see what is written by that load number to determine the location of the remote end of the cable. Both methods are simple and user friendly requiring no deep understanding of electronics or transmission technology.

In the situation where a faulty wire is detected and the fault is due to an open or shorted condition, the location feature may still function provided the short or open is not on the pair being used to identify the cable location. The cable should then be repaired and tested again. In the case where a fault is on the pair being used to identify the cable, the process of elimination can be used to identify all good cables first, then proceed to repair the cables that were not identifiable.

Other features and advantages of the invention will be apparent upon consideration of the following detailed description and appended claims taken in conjunction with the accompanying drawings.

DETAILED DESCRIPTION OF THE INVENTION

The following is a detailed description and explanation of the preferred embodiments and best mode of the method and apparatus of the invention.

The test unit and loads forming the subject matter of the present application is designed to test cables of two or more wires with one of these possibly being the shield in a coaxial cable. First ends of the cables are usually connected to central source from which signals originate at a factory or office, and then the cables are transported to remote locations where second ends of the cables are to be installed on computer ports, modems, telephones, or video equipment to name only a few. For purpose of illustrating the operating principles of the test set, the present description will be confined to a consideration of the testing of cables consisting of four pairs of wires originating at a server computer hub and ending at different remote computer locations. The test unit 22 of FIG. 1 allows various tests to be conducted at either end of the cable provided a test unit load has been installed on the opposite end of the cable. It is customary, but not required, that the test unit is used at the server ends of the cables 11–17 since the location would always indicate the server end if used otherwise. More particularly, the test unit is designed to test the cable wires with attached test unit loads for (1) shorts between individual cable wires, (2) shorts between center conductor and shield if cable is coaxial type, (3) opens in the individual cable wires, (4) mapping of remote plug pin connection and (5) location of the remote end of the cable.

Figure 1:
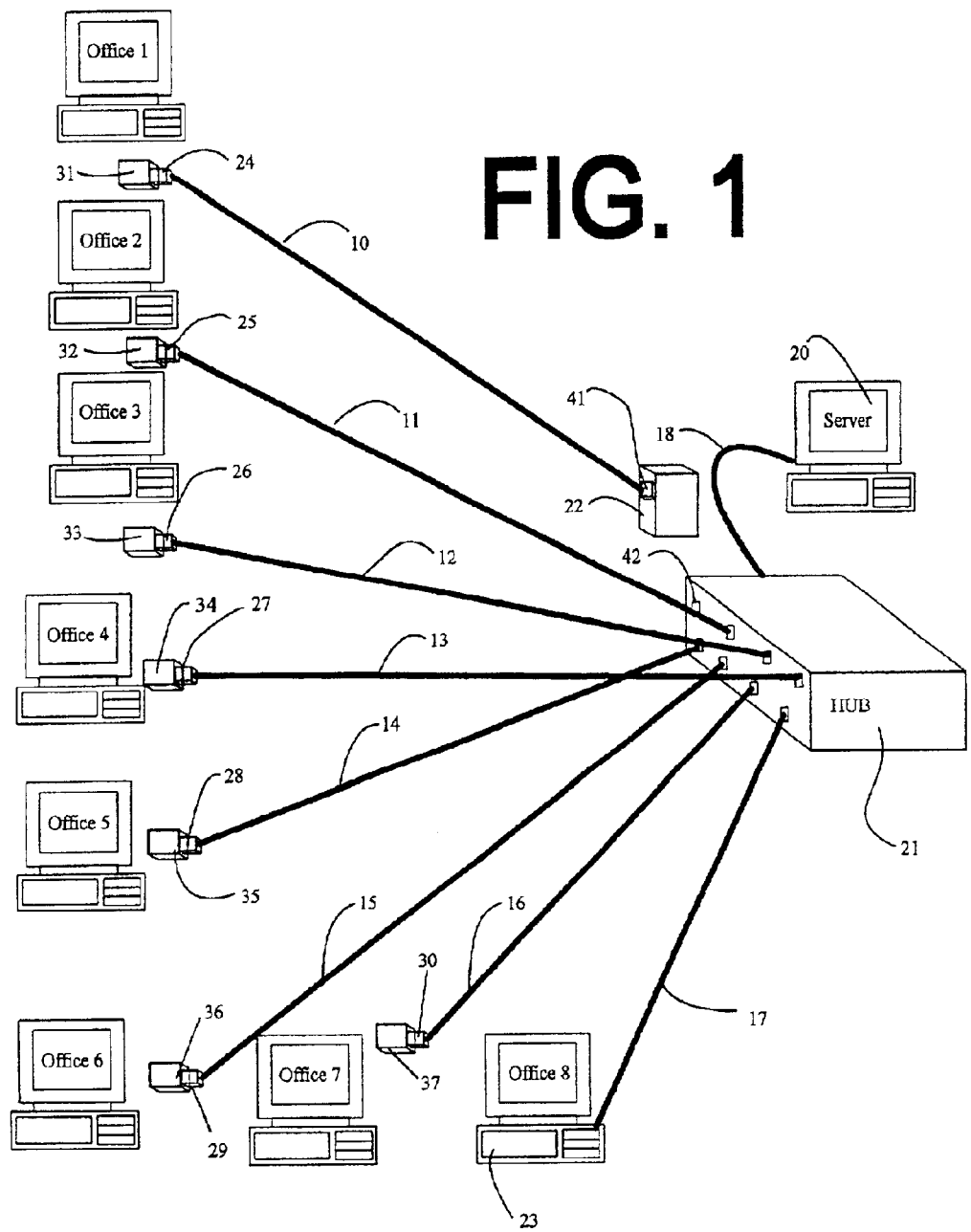
FIG. 1 is a diagram of a typical office with a group of cables originating at a server computer hub and each cable branching to a different office location.

Referring to FIG. 1, the cables to be tested are designated by the reference numerals 10 through 17, which are connected at first ends to server hub 21, which in turn is being driven by server computer 20 via connecting cable 18. The cables 10–17 can be connected to computers 23 comprising office computers 1–8 via plugs 24–30 and mating plugs 31–37 comprising socket receptacles. It should be noted that during the testing of the wires of cable 10, the plugs on cables 11 through 16 are not connected to the test unit but are connected to test unit loads. The remote plugs must be electrically connected to test unit loads and not to other equipment in order to test that cable. The first ends of the cables are, more specifically, connected to the test unit one at a time and using the remote test unit load, wires in each cable are tested sequentially.

Figure 2:
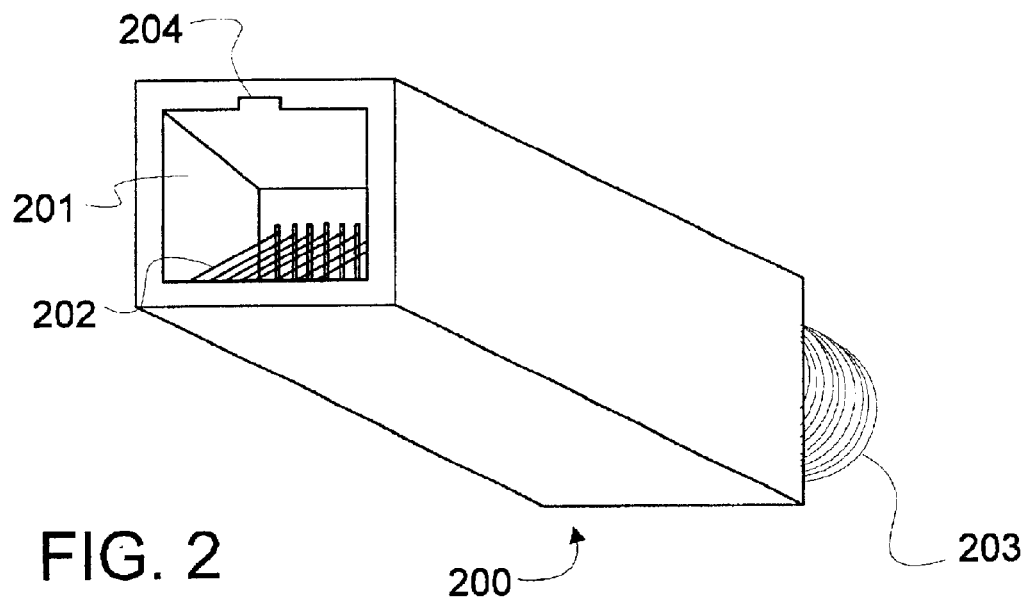
FIG. 2 is a schematic of a test unit with interconnecting eight (8) wire cable terminated with a test unit load at a remote location showing how pairs are generated in the load for correct, reversed, and incorrect wiring.

Referring to FIG. 2 of the drawings, the load contains an RJ type plug 201 and a coaxial type plug 203. Any RJ type connector of 8 wires or less will fit into opening 201 and lock into catch 204, The cable wires will make contact to spring type contacts 202. The coaxial plug 203 provides connection to video and coaxial cables.

Figure 3:
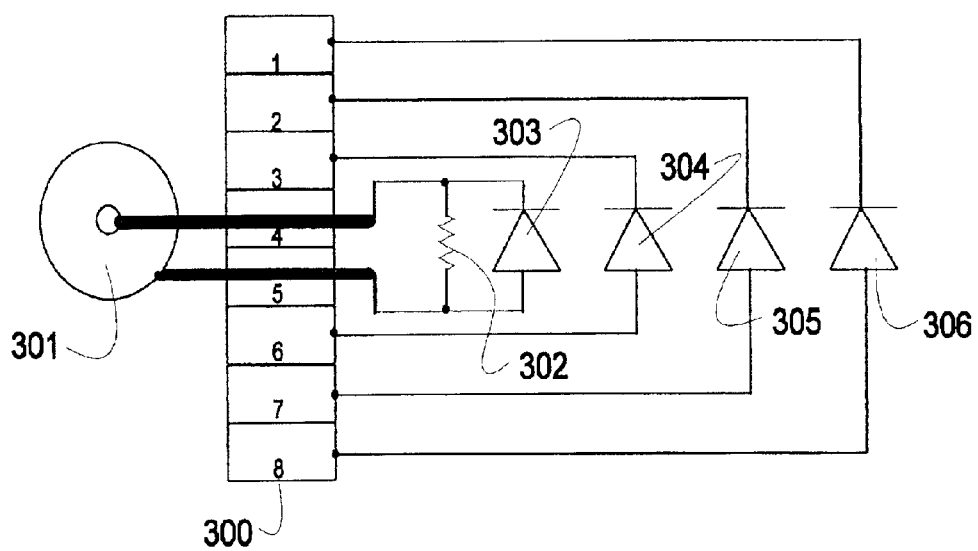
FIG. 3 is a schematic circuit and block diagram of the principal electrical components contained in a test unit for conducting a number of tests on cable connected with a test unit load.

Referring to FIG. 3 of the drawing, the load contains a resistor 302 used to identify that particular load and various diodes 303 through 306 used to identify wire pairs. Diode 306 connects to RJ Plug 300 pins 1 and 8. Diode 305 connects to RJ Plug 300 pins 2 and 7. Diode 304 connects to RJ Plug 300 pins 3 and 6. Diode 303 connects to RJ Plug 300 pins 4 and 5. Coaxial plug 301 is also connected to pins 4 and 5 of the RJ plug.

Figure 4:
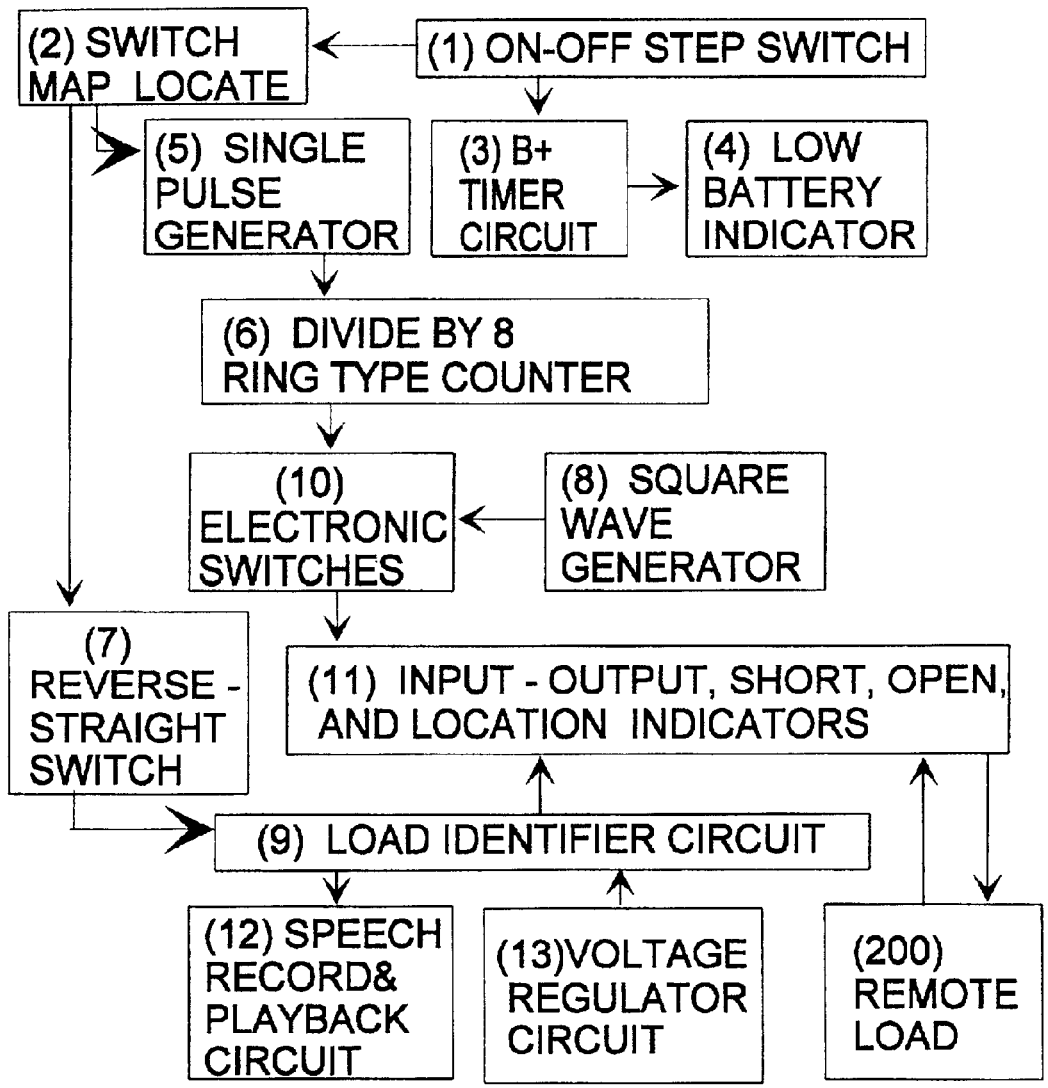
FIG. 4 is a schematic showing circuit connections utilized to conduct short and open wiring tests on the cables, and used to map remote plug connections on a cable without shorts or opens.
Figure 5:
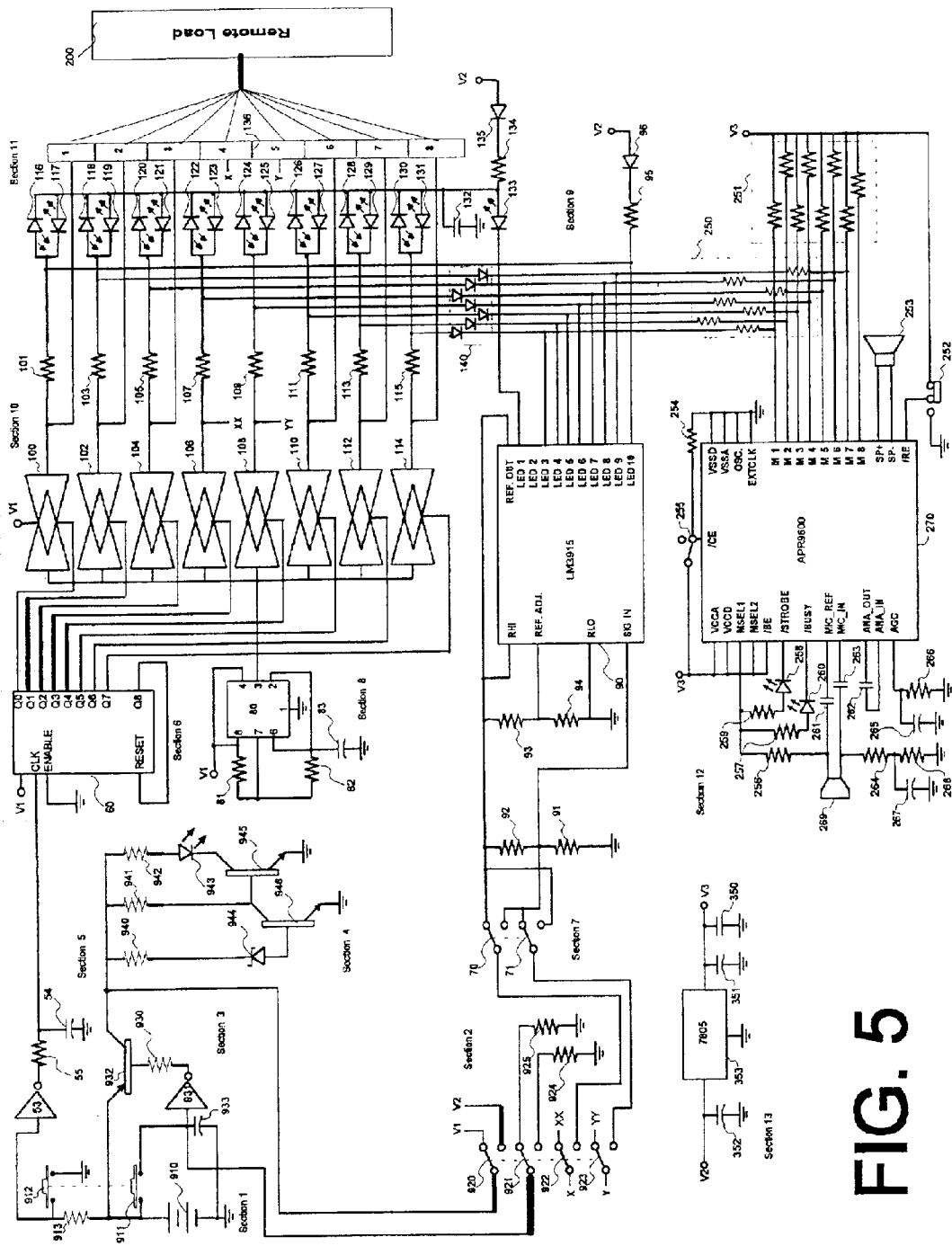
FIG. 5 is a schematic circuit showing the principal electrical components used in the location test for cables terminated with a test unit load containing a unique resistor that identifies that load.

FIG. 4 of the drawings, is a block diagram that describes the tester or test unit 22 of FIG. 1. FIG. 5 shows the schematic for the connection of the electronic parts contained in each block shown in FIG. 4. Each section in dashed lines in FIG. 5 represents a block in FIG. 4. Referring to FIG. 5, when the pushbutton 912 in section 1 is pressed, the capacitor 933 is charged to the battery voltage through one pole of the switch 912. Inverter 931 in section 3 has very high input impedance to prevent capacitor 931 from discharging. The discharge time is therefore set by either resistor 925 or resistor 924 in section 2, depending on the switch position of the 4 pole switch 920 to 923 in section 2. This discharge time determines the turn off time used to shut off the tester when it is left idle. This function is represented in FIG. 4, by Block 3, "B+ TIMER CIRCUIT".

After power is applied to all circuits, the resistor 940 and Zener diode 944 keep the transistor 946 switched on. If the battery voltage 910 falls below the Zener diode 944 voltage, transistor 946 will switch off allowing current to flow through resistor 941 and turn transistor 945 on. Current will then flow through resistor 942 and light emitting diode 943 indicating a low battery voltage condition exist. This function is represented in FIG. 4 by Block 4.

After turning on the tester 22 of FIG. 1, repeated pressing of the ON-OFF switch 912 in Section 1, will reset the turn off time and bring the input of inverter 53 in Section 5 to ground by shorting resistor 913 on that input to ground. This action creates a single pulse that is filtered by resistor 55 and capacitor 54 to eliminate any switch noise. In FIG. 4, this action is represented by block 5, "SINGLE PULSE GENERATOR".

In addition, closure of pushbutton 912 initiates the next pair test by stepping the ring counter 60 to the next position in a ring of 8 possible positions and activates one electronic switch in the switch group 100, 102, 104, 106, 108, 110, 112, and 114. This function is represented by Block 6 in FIG. 4.

When a switch in Section 10 is activated, it switches the output of a continuously running oscillator circuit, Section 8, to impress an AC square wave on one of the cable wires in the RJ type plug 136 of FIG. 5. This action also activates both diodes in the pairs of light emitting diodes that form the group 116 to 131. The AC square wave is sent to the load 200 of FIG. 4 by the connected cable under test 10 through 17 of FIG. 1, passes through one of the load diodes 303 through 306 of FIG. 3, and returns to the tester through the wire connected to the other end of that load diode to another pin on the RJ plug 136 of FIG. 5. Since the load diode blocks current in one direction, only one of the diodes in the pair connected to the return pin of the RJ plug 136 will be activated. The color of the light emitting diode that is activated on the return pin indicates if the cable has been wired straight through or cross pinned. These functions are represented in FIG. 4. by Blocks 8 "SQUARE WAVE GENERATOR", 10 "ELECTRONIC SWITCHES", 11 "INPUT OUTPUT, SHORT, OPEN, AND LOCATION INDICATORS", and 200 "REMOTE LOAD".

OPEN: If a cable pair under test is open, then only the transmitting pair of light emitting diodes will activate. Only two light emitting diodes on indicates an open.

SHORTED: If a cable pair is shorted then the blocking diode in the load is eliminated and both light emitting diodes on the return pin will activate with the transmitting pair. Four or more light emitting diodes on indicates shorts.

GOOD PAIR: When three light emitting diodes activate the pair under test is good.

When switch 920 to 923 of FIG. 5 is placed in the "MAP" mode, the resistance in the load is placed on the input of the load identifier circuit 90. This circuit lights one of the light emitting diodes in the group 116 through 131 according to the load resistance 302 value. In cross pinned cables the diode in the load 303 that is in parallel with the load resistor 302 will become forward biased and change the load resistance value. In cross pinned cables the switch 70,71 is used to reverse the wires of a cross pinned cable to make it into a straight through connection to the load.

This function is performed by Block 9 and Block 7 in FIG. 44.

To maintain accuracy as the battery voltage decreases the Load Identifier Circuit 90 is powered by a voltage regulator circuit 353. This function is performed by Block 13 in FIG. 4.

When the tester 22 of FIG. 1 is in the "MAP" mode the output from the load identifier circuit 90 of FIG. 5 is used to activate one of the memory addresses M1 through M7 in the speech record and playback circuit 270. If record/playback switch 252 is in the record position, a spoken message corresponding to the attached load will be placed into that memory address when the enable button 255 is pressed. If record/playback switch 252 is in the playback position, the prerecorded message corresponding to the attached load 200 of FIG. 4 will be played on the speaker 253 of FIG. 5 when the enable button 255 is pressed. In this manner a prerecorded message can be entered into the tester before the remote load 200 of FIG. 4 is placed on the cable in a remote location. The tester can then sense the load resistor 302 FIG. 3 from the other end of the terminated cable and play back the message that corresponds to that load 200 FIG. 4. In this way each load can have a unique message in any language prerecorded into the tester. This message is capable of being modified by the user each time the enable switch is pressed if the record and playback switch 252 of FIG. 5 is in the record position. Busy lights 258, 260 are provide for both the record and playback mode. This function is represented in FIG. 4 by Block 12.

Though the afore-described applications of the invention relate to a cable that has connectors at one or both ends, it is to be understood that the invention has applicable uses in the testing of cables that do not have connectors at either end. For example, the described test facility may be used to test the integrity of any cable at a cable manufacturing installation or the test facility may be used to test cable extending between any two electrical devices.

Although embodiments of the invention have been shown and described, it is to be understood that various modifications and rearrangements of parts, components, and method steps, can be made by those skilled in the art without departing from the novel spirit and scope of this invention.

What is claimed is:

1. An apparatus comprising a test unit and associated loads used for detecting open, shorted, or improper wire connections of a multiple wire cable as well as location of the remote end of the cable under test, comprising:

a unique load providing a cable-identifying load to identify a cable location associated with electronic recorded speech of a user, said electronic recorded speech comprising the location of the load in the user's own language to identify a remote end of a cable prior to performing one or more tests to detect open, shorted or improper wire connection of the multiple wire cable;

a multiple wire cable comprising pairs of wires to which the unique load associated with the electronic recorded speech is applied prior to performing the one or more tests to detect open, shorted or improper wire connection of the multiple wire cable;

the pair of wires being capable of being tested one at a time with a positive and negative alternating voltage;

a direction of current loop through the unique load and a return wire path is used to indicate a remote plug wiring;

each unique load has an electronic identification associated with one pair of wires and a corresponding load resistance value in parallel with the pair of wires;

a test unit for reading the load resistance value, the test unit comprising a display for indicating;

an open pair if the load resistance value exceeds a preselected value; and a short if either wire in the pair of wires is shorted to another wire.

2. An apparatus comprising a test unit with loads as defined in claim 1, which comprises:

a recording device comprising an electronic recorder to record speech in the language of the user prior to performing the one or more tests to detect open, shorted or improper wire connection of the multiple wire cable to provide the unique load;

the test unit comprising a speaker for emitting an audio sound corresponding to the electronic recorded speech of the user to identify a position of remote termination of the multiple wire cable when the test unit reads the load resistance value from an unloaded end of the cable.

3. A system for mapping a remote plug wiring of a cable by using positive and negative voltages impressed upon a sending wire and a non-linear termination on a remote plug to create a return wire path, comprising;

a return wire path having a current when positive voltage is applied and the remote plug is connected straight through;

the return wire path having a current when negative voltage is applied and the remote plug is connected in a reverse direction;

a load for use in mapping the remote plug wiring of the cable; and the load corresponds to electronic recorded speech electronically applied to the cable, the load providing a cable-identifying load to identify a cable location, the electronic recorded speech specifying a location of the load in the user's own language to identify a remote end of a cable prior to using positive and negative voltages impressed upon a sending wire and a non-linear termination on a remote plug for mapping a remote plug wiring of a cable.

4. A method to determine a remote location of a cable, comprising:

using a group of resistance values greater than what would exist in normal cable wiring and less than the resistance of an open pair of wires in the cable;

separating the resistance values in a load with enough resistance to make normal cable resistance and stray resistance insignificant in accurate value determination;

spacing the resistance values in the group of resistance values with a large enough resistance to make a unique determination readable;

electronically recording human speech comprising a voice in the language of the user to provide electronic recorded speech associated with a load, the electronically recording human speech further comprising specifying the location of the load and location of the cable in the user's own language prior to testing the cable; and applying the load to the cable to help determine the remote location of the cable prior to testing the cable, and the load providing a cable-identifying load to identify a remote end of a cable.

* * * * *